United States Patent [19]

Fazekas

[11] Patent Number: 4,634,972
[45] Date of Patent: Jan. 6, 1987

[54] METHOD FOR MEASURING LOW-FREQUENCY SIGNAL PROGRESSIONS WITH AN ELECTRON PROBE INSIDE INTEGRATED CIRCUITS

[75] Inventor: Peter Fazekas, Munich, Fed. Rep. of Germany

[73] Assignee: Siemens Aktiengesellschaft, Berlin and Munich, Fed. Rep. of Germany

[21] Appl. No.: 633,009

[22] Filed: Jul. 20, 1984

[30] Foreign Application Priority Data

Sep. 23, 1983 [DE] Fed. Rep. of Germany ....... 3334494

[51] Int. Cl.⁴ .............................................. G01R 31/28
[52] U.S. Cl. ................................................. 324/158 R
[58] Field of Search ..................... 250/310, 311, 492.2; 324/158 R, 158 D

[56] References Cited

U.S. PATENT DOCUMENTS 4,220,854  9/1980  Feuerbaum ........................ 250/310
4,277,679  7/1981  Feuerbaum ........................ 250/310

FOREIGN PATENT DOCUMENTS 0062097  10/1982  European Pat. Off. .
0075710   4/1983  European Pat. Off. .

OTHER PUBLICATIONS

H. P. Feuerbaum and J. Otto, Signal Processing for E-Beam Waveform Measurements, Microcircuit Engineering, 1981.
R. L. Malm, Rapid Display of High Speed SEM Voltage Contrast Waveform, IBM Tech. Disc. Bull., vol. 21, No. 7, Dec. 78.
H. P. Feuerbaum and E. Kubalek, "Qualitative and Quantitative Voltage Measurement on Integrated Circuits", Beitr. elektronenmikroskop, Direktabb, vol. 8, (1975).

Primary Examiner—Bruce C. Anderson
Assistant Examiner—Paul A. Guss
Attorney, Agent, or Firm—Hill, Van Santen, Steadman & Simpson

[57] ABSTRACT

A method for measuring a low-frequency signal progression at a measuring point of a specimen by use of an electron probe. A load on the circuit is kept as low as possible by employing a pulsed electron probe during a search of the measuring points. The pulsed electron probe may also be employed for actual measurement. By providing a pulse repitition frequency of the electron probe which is independant of the operating frequency of the circuit specimen, a phase shift of the primary electron pulses relative to the low-frequency signal progression is not necessary for real time measurement of the low-frequency signal progression.

9 Claims, 1 Drawing Figure

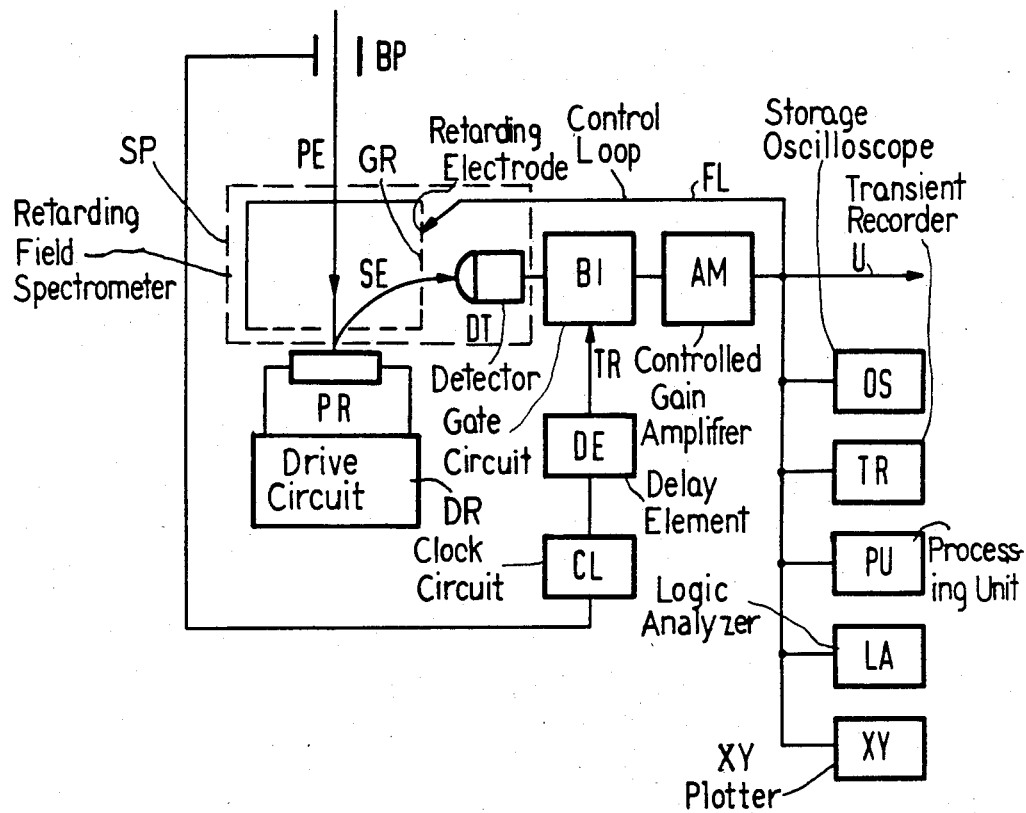

METHOD FOR MEASURING LOW-FREQUENCY SIGNAL PROGRESSIONS WITH AN ELECTRON PROBE INSIDE INTEGRATED CIRCUITS

BACKGROUND OF THE INVENTION

The invention relates to a method for measuring a low-frequency signal progression inside an integrated circuit by use of an electron probe.

Real-time measurements of low-frequency signal progressions in the inside of integrated circuits have been previously executed with a real-time measuring method by use of an unpulsed electron probe (H. P. Feuerbaum et al, Beiträge zur elektronenmikroskopischen Direktabbildung von Oberflächen, 1975, Vol. 8, pages 469–480), incorporated herein by reference. The acquired measured curves are there displayed on an oscilloscope. The disadvantage of this known method is an excessive loading of the integrated circuit during the search for measuring points. This leads to excessively high charging of the circuit to be investigated, thus degrading the quality of the test results.

SUMMARY OF THE INVENTION

An object of the present invention is to keep the load on the circuit as low as possible.

This object is achieved by employing a pulse electron probe for measurement of a low-frequency progression at a measuring point of a circuit specimen during the search for the measuring points. The pulse electron probe may also be employed for actual measurement at a measurement point.

BRIEF DESCRIPTION OF THE DRAWING

The FIGURE shows a block diagram of an apparatus for implementation of a method according to the invention.

DESCRIPTION OF THE PREFERRED EMBODIMENTS

A pulsed electron probe PE is employed during the search for measuring points and during the management in order to keep the load on the circuit PR driven by drive circuit DR as low as possible. The keying or strobe frequency of the electron probe PE is independent of an operating frequency of the circuit PR. A low pulse duty factor can be selected for the pulse sequence of the electron beam pulses PE given employment of a gate circuit BI, for example a boxcar integrator, in the signal processing chain of the electron beam measuring instrument. As a characteristic of a pulse sequence consisting of individual rectangular pulses, i.e. of a periodically repeating sequence of individual rectangular pulses, the pulse duty factor is defined as the ratio of pulse length to period length.

When a signal progression at a measuring point of the specimen PR is measured, the primary electrons which have a specific pulse duty factor impinge upon the measuring point of the specimen PR and trigger secondary electrons SE there at a specific phase of the low-frequency signal progression. A change of the potential at the measuring point corresponding to the low-frequency signal progression causes a shift of the energy distribution of the secondary electrons SE. This energy shift of the secondary electrons SE is traditionally documented with the assistance of a retarding field spectrometer SP. The current of the secondary electrons SE which proceeds to the detector DT is a function of the opposing field at a retarding electrode GR of the retarding field spectrometer SP.

The measuring signal initiated in the detector DT by the secondary electrons SE proceeds to the gate circuit BI, for example to the input gate of a boxcar integrator. A boxcar integrator PAR model 162 of Princeton Applied Research can be employed therefor. A boxcar integrator essentially comprises an integrating gate circuit, for example a sample-and-hold circuit, which can measure periodic, noise-infested signals by repeatedly and successively sampling a signal progression at a specific phase of the signal progression, and thus significantly improve the signal-to-noise ratio in the output signal U of an electron beam measuring instrument by averaging over the corresponding measuring signals that belong to the same phase of the signal progression.

The output signal of the gate circuit BI is amplified in a controlled-gain amplifier AM and supplies the output signal U of the electron beam measuring instrument there. The signal processing chain comprised of detector DT, gate circuit BI, and controlled-gain amplifier AM is closed to form a control loop FL which controls the voltage at the retarding electrode GR of the retarding field spectrometer SP. How such a control loop FL usually functions in an electron beam measuring instrument is disclosed in U.S. Pat. Nos. 4,220,854 and 4,277,679, both incorporated herein by reference.

The clock circuit CL controls a beam blanking means BP of the primary electrons PE and triggers the trigger input TR of the gate circuit BI via a delay element DE. The delay element DE is necessary in order to compensate the transit times of the primary electrons from the means BP for beam blanking to the measuring point on the specimen PR and the transit time of the secondary electrons from the measuring point on the specimen PR to the detector DT, so that the gate of the gate circuit BI is opened precisely when the secondary electron measuring signal is present at the input of this gate circuit BI. The delay element DE must effect a delay of about 200 ns. An average person skilled in the art can acquire such a delay element with commercial equipment.

Given employment of a gate circuit BI, the content of the measuring signal U is independent of the pulse duty factor of the primary electron pulses PE. Given employment of a gate circuit BI, thus a low pulse duty factor can be employed at the primary electron pulses PE without the danger existing that a photomultiplier employed in the detector DT will proceed into its saturation range. The gate circuit BI also enables the measuring signal U to be insensitive to leakage currents, particularly when the pulse duty factor of the primary electron pulses is low.

Given real-time measurement of low-frequency signal progressions at a measuring point of a specimen PR, the electron probe PE is keyed with a frequency prescribed by the clock circuit CL that is independent of the operating frequency of the circuit specimen PR. The gate of the gate circuit BI is triggered synchronously with the frequency of the primary electron pulses SE. Given real-time measurement of a low-frequency signal progression wherein the low-frequency signal progression to be measured is not repeated, the primary electron probe has, for example, a pulse repetition frequency in the MHz range, whereas the low-frequency signal progression has a frequency of less than 100 kHz. The frequency of the primary electron pulses PE is thus at least one order of magnitude higher than the frequency of the low-frequency signal progression. When, for example, the frequency of the low-frequency signal progression is about 1 kHz and the pulse repetition frequency of the primary electron probe PE is about 10 MHz, then $10^7$ primary electron pulses successively impinge the measuring point during, for example, one period of the low-frequency signal progression. Since the frequency of the low-frequency signal progression and the pulse repetition frequency of the primary electron probe PE are of different orders of magnitude, a phase shift of the primary electron pulses PE relative to the low-frequency signal progression is not necessary in the real-time measurement of this low-frequency signal progression. This means that, for example, a boxcar integrator which is employed as gate circuit BI functions as an amplifier with a sample-and-hold input given such a use according to the invention. A phase shift of the primary electron pulses relative to a signal progression at a measuring point occurs, for example, given a higher-frequency signal progression at this measuring point in a so-called sampling method according to the prior art. This is disclosed, for example, in U.S. Pat. No. 4,220,854, incorporated herein by reference.

The low-frequency signal progression U is represented at the oscilloscope of a scanning electron microscope as a function of time t. The registration of the test result in the upper frequency range of the real-time measurement given frequencies above 1 Hz can occur with a storage oscilloscope OS, a transient recorder TR, or a processing unit PU. An X-Y plotter X,Y can also be employed in addition to the devices mentioned above given frequencies of the low-frequency signal progression below 1 Hz. A logic analyzer LA can directly accept the measuring signal U for the logic analysis of the low-frequency signal progression.

Although various minor changes and modifications might be proposed by those skilled in the art, it will be understood that I wish to include within the claims of the patent warranted hereon all such changes and modifications as reasonably come within my contribution to the art.

I claim as my invention:

1. A method for measurement of a signal progression at a given operating frequency at measuring points of a circuit specimen by use of an electron probe, comprising the steps of:
    employing a pulsed electron probe during a search for the measuring points having the operating frequency signal progression thereon and also for actual measurement of the operating frequency signal progression at the measuring points;
    providing a pulse repetition frequency of said electron probe which is independent of the operating frequency of said circuit specimen;
    measuring resulting secondary electrons with a detecting spectrometer; and
    processing detected signals with a gate circuit, the gate circuit being triggered synchronously with the electron probe via a delay element.

2. A method according to claim 1 including the step of providing a pulse repetition frequency of said electron probe which is at least one order of magnitude higher than the operating frequency of said circuit specimen.

3. A method according to claim 1 including the step of recording test results with a storage oscilloscope.

4. A method according to claim 1 including the step of recording test results with a transient recorder.

5. A method according to claim 1 including the step of recording test results with a processing unit.

6. A method according to claim 1 including the step of recording test results with a logic analyzer.

7. A method according to claim 1 including the step of recording test results with an X-Y plotter.

8. A method according to claim 1 including the steps of employing a gate circuit for the signal processing, providing a control gain amplifier connected to an output of the gate circuit, and connecting a control loop from an output of the control gain amplifier to control the voltage at a retarding electrode of the spectrometer, said spectrometer comprising a retarding field spectrometer.

9. A method for measurement of a relatively lower frequency signal progression of a measurement point of a circuit specimen with the use of an electron probe, comprising the steps of:
    employing a pulsed electron probe during a search for a measuring point and for measurement of the signal progression;
    measuring resulting secondary electrons with a detecting spectrometer;
    providing a pulse repetition frequency of the electron probe which is independent of and substantially higher than the low frequency of the signal progression at the measuring point of the circuit specimen; and
    employing a gate circuit with a sample and hold input connected to receive signals from the spectrometer, and said gate circuit being triggered synchronously with said electron probe via a delay element.

* * * * *